United States Patent
Nakatani et al.

(10) Patent No.: US 8,017,940 B2
(45) Date of Patent: Sep. 13, 2011

(54) ORGANIC TRANSISTOR, METHOD OF FORMING ORGANIC TRANSISTOR AND ORGANIC EL DISPLAY WITH ORGANIC TRANSISTOR

(75) Inventors: Shuhei Nakatani, Osaka (JP); Sadayoshi Hotta, Osaka (JP); Hidehiro Yoshida, Osaka (JP)

(73) Assignee: Panasonic Corporation, Osaka (JP)

( * ) Notice: Subject to any disclaimer, the term of this patent is extended or adjusted under 35 U.S.C. 154(b) by 527 days.

(21) Appl. No.: 12/126,363

(22) Filed: May 23, 2008

(65) Prior Publication Data
US 2008/0290339 A1 Nov. 27, 2008

(30) Foreign Application Priority Data

May 25, 2007 (JP) .................... 2007-138504
Apr. 8, 2008 (JP) .................... 2008-100353

(51) Int. Cl.
*H01L 51/00* (2006.01)
(52) U.S. Cl. ........... 257/40; 257/E51.005; 257/E51.018; 257/E29.12; 438/99
(58) Field of Classification Search .......... 257/40, 257/307, 654, E51.005, E51.018, E51.022, 257/E29.12, E21.492; 438/99
See application file for complete search history.

(56) References Cited

U.S. PATENT DOCUMENTS

| 6,194,837 | B1* | 2/2001 | Ozawa | 315/169.1 |
| 7,180,108 | B2 | 2/2007 | Kawase et al. | |
| 7,651,957 | B2* | 1/2010 | Duineveld et al. | 438/780 |
| 2005/0263756 | A1 | 12/2005 | Yatsunami et al. | |
| 2006/0115983 | A1 | 6/2006 | Fujii et al. | |
| 2007/0023837 | A1 | 2/2007 | Lee et al. | |
| 2007/0114524 | A1 | 5/2007 | Oh et al. | |
| 2007/0164293 | A1 | 7/2007 | Hamano et al. | |
| 2007/0241665 | A1 | 10/2007 | Sakanoue et al. | |
| 2007/0290604 | A1 | 12/2007 | Sakanoue et al. | |
| 2008/0135836 | A1* | 6/2008 | Gelinck et al. | 257/40 |
| 2010/0308318 | A1* | 12/2010 | Kawase et al. | 257/40 |

FOREIGN PATENT DOCUMENTS

| JP | 2003-318131 | 11/2003 |
| JP | 2005-223286 | 8/2005 |
| JP | 2006-237477 | 9/2006 |
| JP | 2007-36259 | 2/2007 |
| JP | 2007-53380 | 3/2007 |
| JP | 2008-288239 | 11/2008 |

OTHER PUBLICATIONS

English language Abstract of JP 2008-288239.

(Continued)

*Primary Examiner* — Matthew Landau
*Assistant Examiner* — Colleen E Snow
(74) *Attorney, Agent, or Firm* — Greenblum & Bernstein, P.L.C.

(57) ABSTRACT

The present invention is directed to manufacturing an organic transistor with an organic semiconductor film formed by a coating method, without involving a process of forming a rib for forming the organic semiconductor film. To be more specific, the organic transistor of the present invention includes: (1) a source electrode part and a drain electrode part which are formed on a substrate; (2) rib selectively formed on part of the source electrode part and the drain electrode part; (3) an organic semiconductor film placed in the region defined by the ribs and connecting the source electrode part and the drain electrode part; and (4) a gate electrode formed on the organic semiconductor film through a gate insulating film. The organic transistor of the present invention is characterized in that there is a gap between the rib formed on the source electrode part and the rib formed on the drain electrode part.

5 Claims, 3 Drawing Sheets

OTHER PUBLICATIONS

English language Abstract of JP 2007-36259, Feb. 8, 2007.
English language Abstract of JP 2005-223286, Aug. 18, 2005.
English language Abstract of JP 2007-53380, Mar. 1, 2007.
English language Abstract of JP 2003-318131, Nov. 7, 2003.
English language Abstract of JP 2006-237477; Sep. 7, 2006.

* cited by examiner

ORGANIC TRANSISTOR, METHOD OF FORMING ORGANIC TRANSISTOR AND ORGANIC EL DISPLAY WITH ORGANIC TRANSISTOR

CROSS REFERENCE TO RELATED APPLICATIONS

The disclosure of Japanese Patent Application No. 2007-138504, filed on May 25, 2007 and Japanese Patent Application No. 2008-100353, filed on Apr. 8, 2008, including the specification, drawings and abstract, is incorporated herein by reference in its entirety.

BACKGROUND OF THE INVENTION

1. Field of the Invention

The present invention relates to an organic transistor, a method of forming an organic transistor, and an organic EL display using an organic transistor. The organic semiconductor film for organic transistors of the present invention is manufactured by printing processes such as inkjet printing process and relief printing process.

2. Description of the Related Art

In recent years, there has been a progressive reduction in the price of thin displays, such as plasma displays and liquid crystal displays, and consequently, there is an urgent need to produce such thin displays at lower cost. Accordingly, as low-cost production techniques, printing processes such as inkjet printing process and relief printing process are drawing attention. For example, semiconductor films for silicon transistors, which currently are mainly used, are formed by vacuum process (vacuum deposition, sputtering, etc.) and photolithographic process, and there is a problem that the manufacturing cost is very high. On the other hand, organic transistors with organic semiconductor films formed by printing process using organic semiconductor material can be manufactured at very low cost.

To form an organic semiconductor film by printing process using an organic semiconductor material, ribs (also referred to as "banks" etc.) are required to enclose the regions where the organic semiconductor film is positioned. A rib refers to a physical boundary formed of organic material (polymer, monomer, etc.) or inorganic material.

For example, Japanese Patent Application Laid-Open No. 2003-318131 discloses a method of making device by forming a rib in the perimeter part of an region where a liquid material is to be applied, applying the liquid material to the region enclosed in the rib and drying the liquid material. This method makes vacuum process unnecessary, and, by enclosing the region where liquid material is applied with a rib, the amount of liquid material to be used can be reduced to a minimum, thereby saving the manufacturing cost.

On the other hand, Japanese Patent Application Laid-Open No. 2006-237477 discloses a method of forming a gate electrode by a coating method using a resist mask for a rib, wherein the resist mask also had been used for etching of a gate insulating film.

To make device by printing process as described above, it is necessary to form a rib. Forming a rib generally requires, for example, the following steps of: deposition of a photosensitive resin film by spin coating→baking→exposure→development→cleaning. This formation of a rib is one factor of increased cost of device making.

To form a liquid material in a cell enclosed in ribs by printing process, there is a need to provide a difference in the lyophilic property (or the liquid repellency) between the rib surface and the cell surface. To be more specific, the rib surface needs to be controlled to be water repellent and the cell surface needs to be controlled to be hydrophilic. Methods for such control include making surface lyophilic by oxygen plasma process and making surface liquid repellent by $CF_4$ (tetrafluoromethane) plasma process. However, there is a problem that liquid repellency or hydrophilicity obtained by plasma process is maintained only for several tens of minutes and disappears in a short time. This makes stable device production difficult.

In addition, in the event that the substrate region is large or the material for the substrate is a flexible material such as plastic, there is a problem that, when a rib is formed by photolithography, alignment with the base becomes less accurate and therefore the product yield decreases.

Furthermore, when an organic transistor is made by a coating method using a rib formed by a conventional method, given that the alignment accuracy with the exposure device in the photolithography step is limited, the source/drain electrode and the gate electrode may overlap each other more than necessary. When the source/drain electrode and the gate electrode overlap each other too much, the parasitic capacitance increases, which may cause degradation in transistor characteristics.

SUMMARY OF THE INVENTION

The present invention, first, provides a means for manufacturing an organic transistor with an organic semiconductor film formed by a coating method, without a process of forming a rib only for forming the organic semiconductor film. Next, the present invention provides a means for providing an organic transistor with good characteristics by forming a rib with excellent alignment accuracy, regardless of the size or the type of the substrate. Furthermore, the present invention provides an organic EL display including such an organic transistor.

The present invention is made based upon the idea of forming an organic semiconductor film by a coating method using masking films, through which the patterning of the source and drain electrodes had been made, as ribs. That is to say, the first aspect of the present invention is directed to the following organic transistor:

[1] An organic transistor including: an interdigitated source electrode part and an interdigitated drain electrode part that are formed on a substrate, interdigitated fingers of the source electrode part and the drain electrode part being engaged with each other; ribs that are selectively formed on the lead segments of the interdigitated source electrode part and the interdigitated drain electrode part and on the finger segments located at an end of each lead segment of the interdigitated source electrode part and the interdigitated drain electrode part; an organic semiconductor film that is placed in an region defined by the ribs and that connects the source electrode part and the drain electrode part; and a gate electrode placed on the organic semiconductor film through a gate insulating film, wherein there is a gap between the rib formed on the source electrode part and the rib formed on the drain electrode part.

[2] The organic transistor described in [1], where the ribs serve as masking films for patterning the source electrode part and the drain electrode part,

[3] The organic transistor described in [1] or [2], where the width of the gap between the rib formed on the source electrode part and the rib formed on the drain electrode part is between 20 μm and 200 μm.

[4] The organic transistor described in any one of [1] to [3] where the line width of the interdigitated electrodes in a part where the rib is not placed is smaller than half of the line width of the interdigitated electrodes in a part where the rib is placed.

[5] The organic transistor described in any one of [1] to [4], where the rib exhibits water repellency.

A second aspect of the present invention relates to the following organic transistor manufacturing method.

[6] A method of manufacturing organic transistor comprising the steps of: providing a layered structure including a substrate, a metal film formed on the substrate, and a negative type photosensitive resin film formed on the metal film; patterning the photosensitive resin film in two interdigitated shapes in which interdigitated fingers of the interdigitated shapes are engaged with each other, by irradiating a light upon the photosensitive resin film and developing the photosensitive resin film; forming an interdigitated source electrode part and an interdigitated drain electrode part by etching the metal film using the photosensitive resin film patterned into the interdigitated shapes, as masking films; eliminating a portion of the photosensitive resin film on the interdigitated electrode parts other than the lead segments of the interdigitated source electrode part and the interdigitated drain electrode part and the finger segments located at an end of each lead segment, by irradiating oxygen plasma or UV ozone onto the photosensitive resin film patterned into the interdigitated shapes; and forming, by coating, an organic semiconductor film using part of the photosensitive resin film remaining after the irradiation as a rib.

[7] The method described in [6], where, in the interdigitated source electrode and drain electrode parts, the width of the electrodes in a part where the ribs are not placed is smaller than half of those in a part where the ribs are placed.

[8] The method described in [6] or [7], where the thickness of the photosensitive resin film is greater than the line width of the electrodes in a part where the ribs are placed.

[9] The method described in [6], where, in the step of patterning the photosensitive resin film into interdigitated shapes, by irradiating a light upon the photosensitive resin film through a half-tone mask and developing the photosensitive resin film, the thickness of the photosensitive resin film in parts corresponding to the lead segments and the fingers located at an end of each lead segment, is made greater than the thickness of the photosensitive resin film in parts corresponding to the fingers other than the fingers located at the end of each lead segment.

[10] The method described in any one of [6] to [9], where the photosensitive resin film comprises a water-repellent resin film.

[11] The method described in any one of [6] to [10], further comprising the steps of: forming a gate insulating film on the organic semiconductor film; and forming a gate electrode on the gate insulating film.

[12] The method according to any one of [6] to [10], where: a gate electrode and a gate insulating film are placed on the substrate; and the metal film is stacked on the gate insulating film.

A third aspect of the present invention relates to the following organic EL display.

[13] An organic EL display comprising the organic transistor described in one of [1] to [5].

According to the present invention, an organic transistor can be made skipping the process of forming a rib for forming an organic semiconductor film, its productivity improves. In addition, it is not necessary to peel the resist film for forming the source electrode part and the drain electrode part, therefore residue of the resist film is not left.

Furthermore, alignment accuracy improves regardless of the size or the type of the substrate. The organic transistor of the present invention makes smaller the region where the source electrode or the drain electrode and the gate electrode overlap each other, and therefore reduce the parasitic capacity and improves the transistor characteristics.

DETAILED DESCRIPTION OF THE PREFERRED EMBODIMENT

1. Organic Transistor Manufacturing Method

The method of manufacturing organic transistor of the present invention includes the steps of: (1) patterning the source electrode and the drain electrode through masking films obtained by photolithography; and (2) applying an organic semiconductor material using as ribs the masking films for the patterning the source electrode and the drain electrode. The method of manufacturing organic transistor will be described with reference to FIG'S. 1 to 3.

Figure 1A:
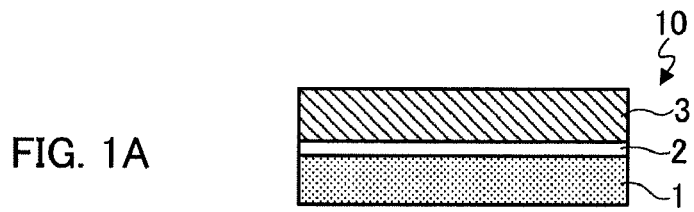
FIGS. 1A to 1F shows cross-sectional views of the steps in the process of the method of manufacturing organic transistor of the present invention.

First, layered structure 10, which includes substrate 1, metal film 2 formed on the substrate, and negative type photosensitive resin film 3 formed on the metal film, is prepared (FIG. 1A). Substrate 1 may be either an inorganic material or an organic material, as long as substrate 1 is an insulating material and may be composed of, but are not limited to, PET (Polyethylene Terephthalate), PEN (Polyethylene Naphthalate), glass, etc.

When a back-gate type organic transistor is manufactured, it is preferable to place a gate electrode and an insulting film for covering the gate electrode on substrate 1 (not shown), and stack metal film 2 and photosensitive resin film 3 on the gate insulating film.

Metal film 2 is patterned into a source electrode and a drain electrode. The material for metal film 2 is therefore preferably gold, chromium, silver, copper, aluminum, platinum, etc. The thickness of the metal film can be about 100 nm.

Photosensitive resin film 3 is preferably a negative type. A negative type photosensitive resin film refers to a resin film in which the part irradiated with light (e.g., ultraviolet ray) is cured, and in which, on the other hand, the part that is not irradiated with light is dissolved in a developer (e.g., alkaline solution) and removed in the developing step. The thickness of photosensitive resin film 3 is usually 1 to 10 μm. Photosensitive resin film 3 is patterned by photolithography to form masking films (see 3A and 3B in FIG. 1B) for patterning the source electrode and the drain electrode and also to form ribs (see 4A and 4B in FIG. 1D) for applying ink containing organic semiconductor material.

The ribs (see 4A and 4B in FIG. 1D) enclosing the region where organic semiconductor material is to be applied, need to be liquid repellent. By making the ribs liquid repellent, printed ink is prevented from suppressed from going over the ribs and leaking out. Therefore, photosensitive resin film 3 preferably has water repellency. Preferable examples of water-repellent resin films include, for example, fluorine-containing resin films. More preferably, the fluorine-containing resin film contain a fluorine component in the material and the fluorine component come out on the surface layer of the film upon baking, thereby exhibiting water repellency.

By using a water-repellent resin as the material for photosensitive resin film 3, there is no need to perform the process of adjusting the liquid repellency of formed ribs. Conventional adjustment of hydrophilicity or water repellency by plasma process has a problem that the hydrophilicity or water repellency obtained by the process is maintained only for a short period of time. On the other hand, the hydrophilicity or liquid repellency of the ribs formed by the present invention can be stably maintained for several days. In addition, plasma process can be skipped, so that the production cost can be reduced.

Figure 1B:
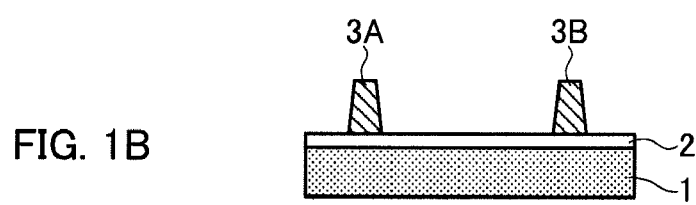

By irradiating light upon photosensitive resin film 3 and developing photosensitive resin film 3, photosensitive resin film 3 is patterned into an interdigitated shape (FIG. 1B). To be more specific, by irradiating light upon photosensitive resin film 3 through a mask having interdigitated openings, the irradiated portion of the resin film is cured. The light to be irradiated is appropriately selected according to the photosensitivity of the photosensitive resin film and can be ultraviolet ray, X ray, etc. The resin film cured by the irradiation of light is developed with a developer. The developer is selected according to the type of photosensitive resin film. When the resin is dissolvable in an alkaline solution, an alkaline solution may be used as a developer.

Figure 2:
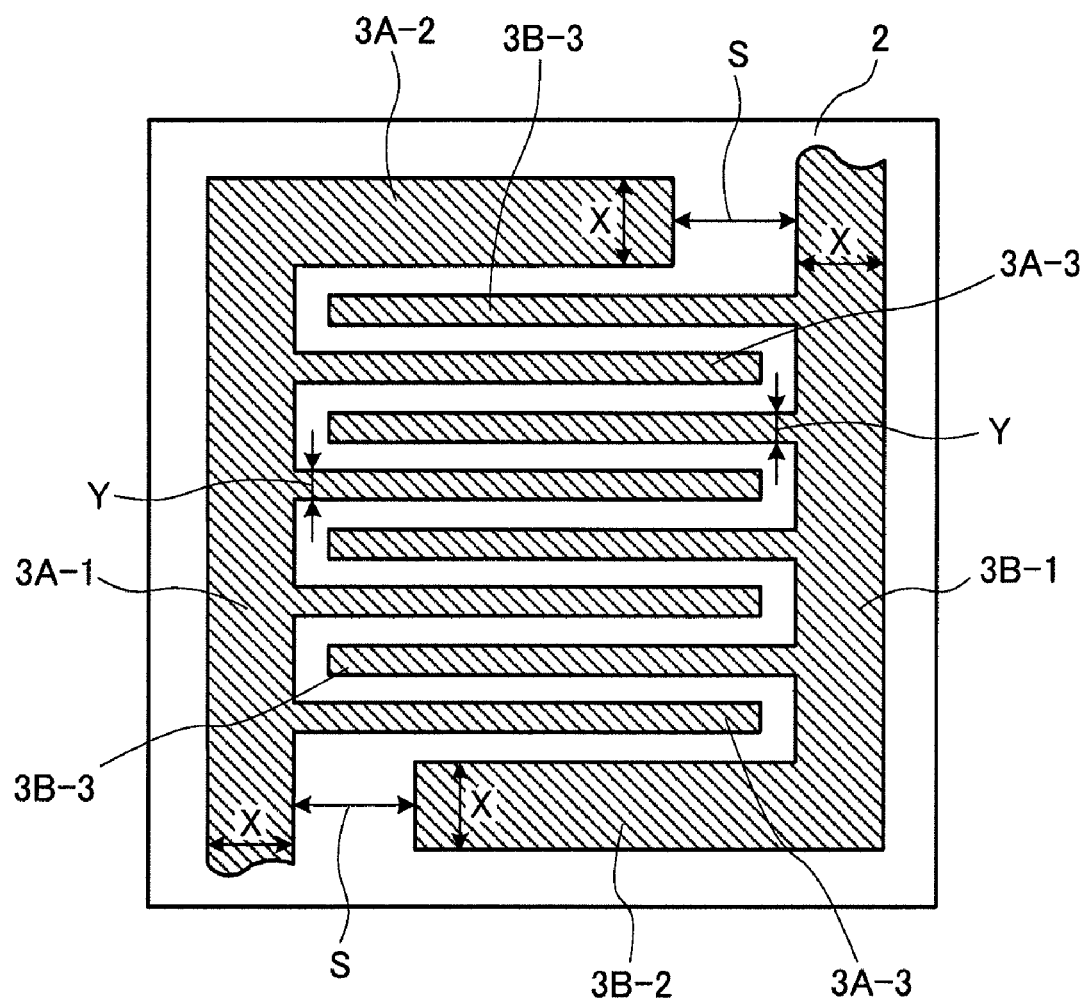
FIG. 2 is a top view of FIG. 1B.

The patterning shape is one in which two interdigitated shapes face each other. An example of the interdigitated shape is shown in FIG. 2. That is, FIG. 2 is a top view of the layered structure shown in FIG. 1B. As shown in FIG. 2, fingers of films 3A and 3B patterned into interdigitated shapes are engaged facing each other. The interdigitated shapes have the lead segments (3A-1, 3B-1) of the interdigitated electrodes and the segments composing the fingers (3A-2 and 3A-3, 3B-2 and 3B-3).

Characteristic 1 of the Resin Film Obtained After Patterning

The width X of the lead segments (3A-1 and 3B-1) of the interdigitated electrodes and those (3A-2 and 3B-2) of interdigitated fingers, present at an end of each lead segment of the interdigitated electrodes, is twice or more the width Y of the fingers (3A-3 and 3B-3) other than the fingers present at an end of each lead segment of the interdigitated electrodes. The width X is preferably usually 1 to 10 μm.

Also, the width X is preferably smaller than the thickness T of the photosensitive resin film. Namely, the thickness T of the photosensitive resin film and the widths X and Y preferably satisfy the following relationship:

$$T > X > 2Y$$

By adjusting the line widths of electrodes, ribs can be formed only on the perimeters (3A-1 and 3A-2 and 3B-1 and 3B-2) of the source electrode part and the drain electrode part (which will be described in detail later), so that organic semiconductor material can be applied efficiently. If the ribs are also present on top of the interdigitated finger segments of the interdigitated electrodes, when organic semiconductor material is applied, the material may not be formed uniform. In addition, by forming the source electrode and the drain electrode into interdigitated shapes, the surface area of the electrodes increases and a larger amount of current can flow, thereby making an organic transistor with excellent characteristics.

Characteristic 2 of the Resin Film Obtained After Patterning

Instead of adjusting the line widths of the interdigitated shapes, the thickness of the resin film patterned in interdigitated shapes may be controlled. To be more specific, the thickness of the photosensitive resin film in parts corresponding to the lead segments (3A-1 and 3B-1) of the interdigitated electrodes and the fingers (3A-2 and 3B-2) located at an end of each lead segment of the interdigitated electrodes may be greater than the thickness of the photosensitive resin film in parts corresponding to the fingers (3A-3 and 3B-3) other than the fingers located at an end of each lead segment of the interdigitated electrodes. Controlling the thickness of the patterned resin film also enables the formation of ribs only on the perimeters (3A-1 and 3A-2 and 3B-1 and 3B-2) of the source electrode part and the drain electrode part.

To partially and selectively control the thickness of the resin film obtained after patterning, exposure light is irradiated through a half-tone mask, for example. That is, the amount of light to be irradiated upon the lead segments (3A-1 and 3B-1) of the interdigitated electrodes and the fingers (3A-2 and 3B-2) located at an end of each lead segment of the interdigitated electrodes is set greater than the amount of light to be irradiated upon the fingers (3A-3 and 3B-3) other than the fingers located at an end of each lead segment of the interdigitated electrodes. On the other hand, when the photosensitive resin film is a positive type, the amount of light to be irradiated upon the fingers (3A-3 and 3B-3) other than the fingers located at an end of each lead segment of the interdigitated electrodes is set greater than the amount of light to be irradiated upon the fingers (3A-2 and 3B-2) located at an end of each lead segment of the interdigitated electrodes.

Figure 1C:
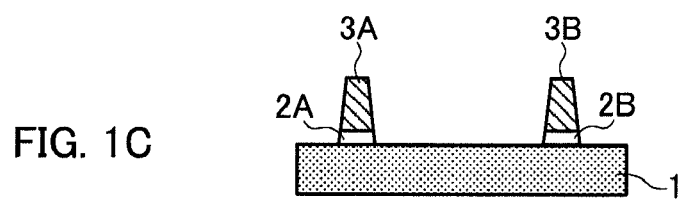

Using photosensitive resin films 3A and 3B patterned in interdigitated shapes, as masking films, metal film 2 is etched and patterned in interdigitated shapes (FIG. 1C). Etching of metal film 2 may be performed using an etchant. For example, when metal film 2 is gold, aqua regia or an aqueous solution of potassium iodide and iodine may be used as the etchant. By this means, on substrate 1 is obtained a layered structure in which the patterned metal films (source electrode 2A and drain electrode 2B) and patterned photosensitive resin films 3A and 3B are stacked on top of one another (FIG. 1C).

According to conventional techniques, patterned photosensitive resin films 3A and 3B are peeled off after metal film 2 is etched. On the other hand, the present invention is characterized in that, without peeling off photosensitive resin films 3A and 3B, the next process is started.

Figure 1D:
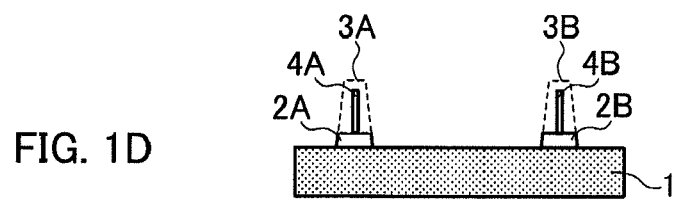

Oxygen plasma irradiation process or UV ozone irradiation process is performed on photosensitive resin films 3A and 3B of the layered structure obtained by etching. Oxygen plasma irradiation is performed in a manner such that the entire obtained layered structure is introduced into a plasma chamber. When plasma is irradiated, photosensitive resin films 3A and 3B are etched and become gradually smaller, resulting in 4A and 4B (FIG. 1D). The plasma irradiation is preferably performed in a down-flow type plasma processing apparatus. When the whole of the layered structure introduced inside the plasma chamber is exposed to a down-flow type plasma atmosphere, photosensitive resin films 3A and 3B are readily isotropically etched (up, down, left, and right, equal in all directions).

The applied power for oxygen plasma irradiation is preferably set to about 200 to 300 [W] and the oxygen flow rate is preferably set to 50 to 100 [ml/min]. The processing time is set to about 10 minutes, thereby etching over 200 to 500 [nm] (preferably about 400 [nm]).

Figure 3:
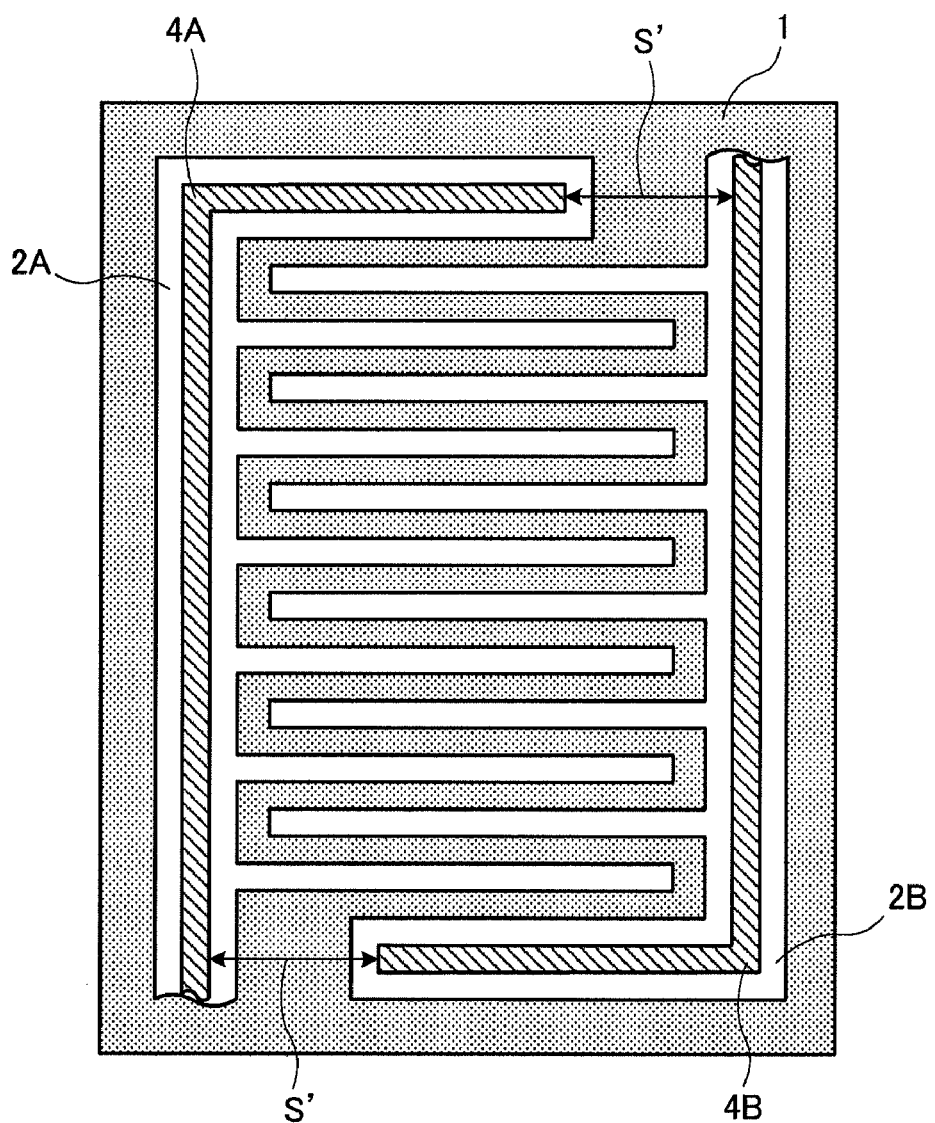
FIG. 3 is a top view of FIG. 1D.

FIG. 3 is a top view of the layered structure shown in FIG. 1D. As shown in FIG. 3, by oxygen plasma irradiation process or UV ozone irradiation process, of photosensitive resin films 3A and 3B patterned such that two interdigitated shapes face each other, the portions of the films formed on the lead segments (3A-1 and 3B-1) of the interdigitated electrodes and on the segments (3A-2 and 3B-2) corresponding to the fingers present at and end of each lead segment of the interdigitated electrodes, remain as 4A and 4B. The portions of the films formed on the segments (3A-3 and 3B-3) corresponding to the interdigitated fingers are eliminated.

That is, as described above, the width Y of 3A-3 and 3B-3 is smaller than the width X (see the above-described "characteristic 1 of the resin film obtained after patterning"), so that, even when the photosensitive resin films 3A-3 and 3B-3 are eliminated, part of the photosensitive resin films 3A-1 and 3B-1 and 3A-2 and 3B-2 remains as 4A and 4B. As such, since the relationship "T>X>2Y" is satisfied, as shown in FIG. 1D, when substrate 1 is introduced into the chamber to perform isotropic etching, ribs 4A and 4B can be formed only along the perimeter of the source/drain electrodes.

Also, in the event that the thickness of resin films 3A-3 and 3B-3 is thinner than the thickness of resin films 3A-1 and 3B-1 and 3A-2 and 3B-2 (see the above-described "characteristic 2 of the resin film obtained after patterning"), similarly, even when photosensitive resin films 3A-3 and 3B-3 are eliminated, part of photosensitive resin films 3A-1 and 3B-1 and 3A-2 and 3B-2 remains as 4A and 4B.

By oxygen plasma irradiation processor UV ozone irradiation process, electrode parts 2A and 2B are completely exposed in portions 3A-3 and 3B-3. In portions 3A-1 and 3B-1 and 3A-2 and 3B-2 too, electrode parts 2A and 2B are exposed around residual portions 4A and 4B (FIG. 3). By exposing the electrode parts, the connectivity between the electrode parts and the organic semiconductor film can be enhanced.

Figure 1E:
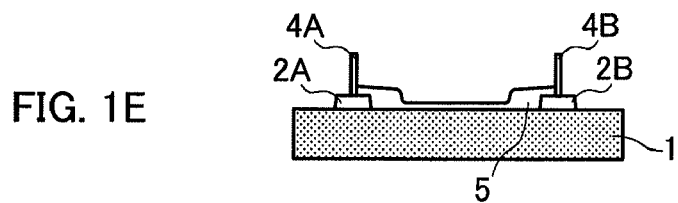

Subsequently, ink containing an organic semiconductor material is applied using the above-described remaining photosensitive resin films 4A and 4B as ribs, to form organic semiconductor film 5 (FIG. 1E).

Masking film 3A for etching source electrode 2A and masking film 3B for etching drain electrode 2B are necessarily separated, and thus there are gaps S (see FIG. 2). This is because the source electrode and the drain electrode need to be structurally separated. Accordingly, there are necessarily gaps S' also between ribs 4A and 4B formed by oxygen plasma irradiation process or UV ozone irradiation process (see FIG. 3). In order to prevent applied ink from flowing out through these gaps S', the width of gaps S' needs to be appropriately controlled. Hence, although the width of gaps S' is better to be narrower, when gaps S' are too narrow, the capillary phenomenon may occur and ink may leak out.

In view of this, the width of gaps S' is set such that the capillary phenomenon does not occur in gaps S'. The capillary phenomenon is a phenomenon where a liquid flows through a channel with a very small diameter and the pressure generated by the surface tension (interfacial tension) between the channel and the liquid serves as the driving force. The pressure generated by the surface tension (interfacial tension) is expressed by the following equation:

(Equation 1)

$$\Delta p = \frac{\mathrm{Re} \times f \times \eta \times u}{(2D^2) \times x} \quad [1]$$

$\Delta p$ : pressure $(Pa)$ generated by surface tension
$\mathrm{Re} \times f$ : tube friction coefficient
$x$ : traveling distance $(m)$
$D$ : hydraulic diameter $(m)$
$u$ : velocity $(m/s)$
$\eta$ : viscosity coefficient $(Pa \cdot s)$ When the width of gaps S' between ribs 4A and 4B is "b" and the height of ribs 4A and 4B is "h," hydraulic diameter D is calculated by the following equation. Based on the following equation, the width b of gaps S' is set. As such, the width b of gaps S' varies depending on the viscosity of ink to be applied but is usually in a range of 20 to 200 μm.

(Equation 2)

$$D = \frac{4 \times b \times h}{(2 \times b + 2 \times h)} \quad [2]$$

$b$ : width $(m)$ between ribs on source/drain electrodes
$h$ : height $(m)$ of the ribs Application of ink containing organic semiconductor material on the region enclosed by ribs 4A and 4B can be performed by, for example, inkjet printing process and relief printing process. Examples of the organic semiconductor material include porphyrin, pentacene and tetracene. The thickness of organic semiconductor film 5 to be formed should be about 100 [nm].

Figure 1F:
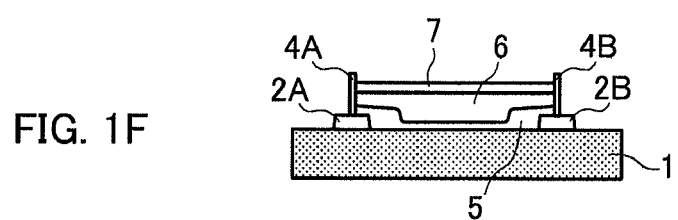

When a top-gate type organic transistor is manufactured, after formation of organic semiconductor film 5, gate insulating film 6 and gate electrode 7 are sequentially formed (FIG. 1F). The thickness of gate insulating film 6 is about 500 [nm] and the thickness of gate electrode 7 is 100 [nm] but the thicknesses are not particularly limited. As the material for gate insulating film 6, an inorganic compound such as silicon oxide or silicon nitride and an organic compound such as benzocyclobutene can be used. As the material for gate electrode 7, chromium, silver, aluminum, gold or tantalum, or a multilayer-structure material thereof, a composite material thereof, and so on, may be used. The method of forming gate insulating film 6 and gate electrode 7 may be printing process such as inkjet printing process and relief printing process, or may be a method using vacuum process such as vacuum deposition and sputtering.

On the other hand, when aback-gate type organic transistor is manufactured, a gate electrode and a gate insulating film are placed in advance on the substrate and the above-described metal film 2 and the above-described photosensitive resin film 3 are stacked on the gate insulating film.

2. Organic Transistor

The organic transistor of the present invention includes: a substrate; a source electrode part and a drain electrode part which are formed on the substrate; a rib placed on part of the source electrode part and the drain electrode part; an organic semiconductor film placed in the region defined by ribs, and connecting the source electrode part to the drain electrode part; and a gate electrode formed on the organic semiconductor film through a gate insulating film. The organic transistor of the present invention may be either what is commonly referred to as a "top-gate type organic transistor" or "back-gate type organic transistor." In the case of the "top-gate type," a gate insulating film is provided on a semiconductor film and a gate electrode is provided on the gate insulating film. In the case of the "back-gate type," a gate electrode and a gate insulating film covering the gate electrode are placed on a substrate and source/drain electrodes and an organic semiconductor film that connects a source electrode part to a drain electrode part are placed on the gate insulating film.

The organic transistor of the present invention is manufactured by, for example, the above-described manufacturing method, but is not limited to this method. For example, instead of etching by oxygen plasma irradiation process or UV ozone irradiation process, by atmospheric-pressure plasma or laser ablation, the photosensitive resin film on the interdigitated finger parts (3A-3 and 3B-3 in FIG. 2) can be selectively removed.

The source electrode part and the drain electrode part formed on the substrate preferably have an interdigitated shape. The interdigitated source and drain electrode parts are placed in a state their interdigitated fingers are engaged.

Mobility (μ), which is one of the transistor characteristics, is, as shown in the following equation, (1) proportional to the contact area (W) between the source and drain electrodes, and the semiconductor film; and (2) inversely proportional to the distance (L) between the source electrode and the drain electrode. Consequently, to increase the contact area (W), the source electrode and the drain electrode preferably have an interdigitated shape (see FIG. 3), both are placed such that their interdigitated fingers are engaged.

(Equation 3)

$$\mu = \frac{k \times W}{L} \quad [3]$$

μ : mobility
k : constant
W: contract area between source/drain electrodes and a semiconductor film
L: distance between the source/drain electrodes The ribs are characterized in that the ribs do not completely enclose the circumference of the organic semiconductor film and have slight gaps. This is because the ribs are also used as masking films for patterning the source electrode and the drain electrode, and are necessarily separated.

The ribs (made of usually resin) is formed on part of the source electrode part and the drain electrode part. To be more specific, when the source electrode part and the drain electrode part have an interdigitated shape, a rib is formed on (1) the lead segments of the interdigitated electrodes, and on (2) the fingers located at the end of the lead segments (see FIG. 3) amongst the fingers.

The ribs are formed on (1) the lead segments of the interdigitated electrodes, and on (2) the fingers located at the end of the lead segments amongst the fingers, and do not cover the entire portions of the electrode parts and instead allow part of these portions to be exposed (see FIG. 3). An organic semiconductor film is placed on the exposed part (see FIG. 1E) so that the connectivity between the organic semiconductor film and the electrode parts improves.

3. Organic EL Display

The organic EL display of the present invention is characterized by including the above-described organic transistor, and the rest of the display may be the same as conventional organic EL displays. The organic transistor is used, for example, as the drive TFT or as switching TFT for organic EL elements.

INDUSTRIAL APPLICABILITY

According to the organic transistor, the organic EL display using the organic transistor and the method of forming the organic transistor, according to the present invention, can remove the rib forming process. In addition, since the masking films for patterning the source electrode part and the drain electrode part do not need to be peeled off, there is no concern that residue of the resist film may remain. Accordingly, the cost of production of organic transistors involving printing process such as inkjet printing process and relief printing process can be reduced.

Furthermore, regardless of the size and the type of the substrate, ribs can be formed with excellent alignment accuracy. Moreover, since the region where the source/drain electrode and the gate electrode overlap each other can be reduced to a minimum, an organic transistor with reduced parasitic capacitance can be obtained.

The organic transistor of the present invention is applicable to, for example, semiconductors (TFT) for organic EL displays.

What is claimed is:

1. An organic transistor comprising:
    a source electrode part and a drain electrode part that are formed on a substrate, fingers of the source electrode part being interdigitated with fingers of the drain electrode part;
    ribs that are selectively formed on lead segments of the source electrode part and the drain electrode part, and on finger segments located at an end of each lead segment of the source electrode part and the drain electrode part;
    an organic semiconductor film that is placed in a region defined by the ribs and that connects the source electrode part and the drain electrode part; and
    a gate electrode placed on the organic semiconductor film through a gate insulating film,
    wherein there is a gap between a rib formed on the source electrode part and a rib formed on the drain electrode part, and the ribs serve as masking films for patterning the source electrode part and the drain electrode part.

2. The organic transistor according to claim 1, wherein the width of the gap between the rib formed on the source electrode part and the rib formed on the drain electrode part is between 20 μm and 200 μm.

3. The organic transistor according to claim 1, wherein a line width of parts of the electrode parts where the ribs are not placed is smaller than half of a line width of parts of the electrode parts where the ribs are placed.

4. The organic transistor according to claim 1, wherein the ribs are water repellant.

5. An organic electroluminescent display comprising the organic transistor according to claim 1.

* * * * *